United States Patent
Rumpf

(10) Patent No.: US 6,506,293 B1
(45) Date of Patent: Jan. 14, 2003

(54) PROCESS FOR THE APPLICATION OF A METAL FILM ON A POLYMER SURFACE OF A SUBJECT

(75) Inventor: Thomas Rumpf, Gmunden (AT)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/719,802

(22) PCT Filed: Jun. 18, 1999

(86) PCT No.: PCT/AT99/00160

§ 371 (c)(1),
(2), (4) Date: Feb. 8, 2001

(87) PCT Pub. No.: WO99/67321

PCT Pub. Date: Dec. 29, 1999

(30) Foreign Application Priority Data

Jun. 19, 1998 (AT) .............................................. 1059/98

(51) Int. Cl.$^7$ ............................. C23C 28/02; C25D 5/34
(52) U.S. Cl. ...................................... 205/186; 205/205
(58) Field of Search ................................ 205/205, 186; 427/537, 539, 576

(56) References Cited

U.S. PATENT DOCUMENTS

| 3,801,368 | A |   | 4/1974 | Fusayama et al. ........... 117/239 |
| 4,250,225 | A | * | 2/1981 | Shirahata et al. ........... 428/336 |
| 4,869,930 | A |   | 9/1989 | Clarke et al. ................ 427/252 |
| 4,965,090 | A |   | 10/1990 | Gartner et al. ................ 427/39 |
| 4,990,363 | A |   | 2/1991 | Suhr et al. .................... 427/40 |
| 5,019,415 | A |   | 5/1991 | Oehr et al. .................... 427/39 |
| 5,527,566 | A |   | 6/1996 | Schadt et al. ................ 427/536 |

FOREIGN PATENT DOCUMENTS

| DE | 196 13 135 A1 | 4/1996 |
| EP | 0 478 975 A2 | 9/1991 |
| EP | WO 96/192051 | 4/1996 |
| WO | 96/12051 | 4/1996 |

* cited by examiner

Primary Examiner—Edna Wong
(74) Attorney, Agent, or Firm—Paul & Paul

(57) ABSTRACT

A process for the application of a metal film on a polymer surface of a subject, to which, after nucleation with a catalytically active platinum metal and/or a platinum metal compound, a coating metal is precipitated autocatalytically from an aqueous solution without any external current supply, before at least another layer is applied, preferably electrolytically under external current supply, to this preliminary coating. To achieve favorable construction features, it is suggested that centers of a Lewis acid or Lewis base are enriched first on the polymer surface to be coated by a vacuum plasma treatment via a plasma gas adapted to the polymer used, before the polymer surface is nucleated under vacuum with the platinum metal and/or the platinum metal compound by another plasma gas containing an evaporated platinum metal and/or a platinum metal compound for nucleophilic and/or electrophilic reaction on the Lewis acids and/or Lewis bases.

7 Claims, No Drawings

PROCESS FOR THE APPLICATION OF A METAL FILM ON A POLYMER SURFACE OF A SUBJECT

FIELD OF THE INVENTION

The invention relates to a process for the application of a metal film on a polymer surface of a subject, to which, after nucleation with a catalytically active platinum metal and/or a platinum metal compound, a coating metal is precipitated autocatalytically from an aqueous solution without any external current supply, before at least one further layer is applied, preferably electrolytically under external current supply, to this preliminary coating.

DESCRIPTION OF THE PRIOR ART

Plastic components, which provide benefits with respect to their specific gravity and in terms of simple shaping compared with metal components, are metallised because of their outer appearance, on the one hand, and to influence their surface properties, particularly in terms of electric conductivity, mechanical properties or chemical resistance, on the other hand. However, this is difficult in case of subjects with a polymer surface, as the polymer surface of the subject to be coated must be pretreated by complex processes, before the metal coating can be applied electrolytically with sufficient adhesion. As it is, the polymer surface to be coated is first nucleated with noble metals, in general platinum metals, i.e. elements of the $8^{th}$ sub-group of the period system (Ru, Rh, Pd, Os, Ir, Pt), and/or compounds thereof, to then be able to realise premetallisation via an autocatalytic precipitation of a coating metal from an aqueous solution without external current supply. Nucleation of the polymer surface with a platinum metal requires a preliminary wet-chemical treatment in pickling and activation baths consisting of solutions of strong and frequently concentrated acids and lyes as well as toxic compounds. For example, in a conventional process the polymer surface is pre-pickled, after cleaning with alcohol and/or an organic solvent, in a bath of chromic-sulfuric acid mixture at increased temperature, to be then subjected to the pickling process proper in chromic-sulfuric acid mixture at increased temperature. Next to the preliminary treatment with an acid, the polymer surface can be nucleated, after neutralisation of the pickled polymer surface, with a platinum metal from an appropriate platinum metal solution. By means of the described multi-stage preliminary treatment of the polymer surface a good adhesion of the platinum metal nuclei at the polymer surface shall be ensured as a prerequisite for an appropriate adhesion of the premetallising cost, to which a thicker metal coating is subsequently applied in a conventional way by electrolytic precipitation of the coating metal under external current supply. The drawback of this known metallisation of polymer surfaces is not only the comparatively complex process, but also the fact that waste water containing heavy metals is generated during preliminary treatment of the polymer surface. Moreover, in the area of the pickling and activation baths toxic vapours are to be expected, and on top of that a considerable demand of chemicals must be taken into account.

SUMMARY OF THE INVENTION

It is therefore the objective of the invention to avoid these drawbacks and to design a process for the application of a metal film on a polymer surface of a subject of the above mentioned kind in such a way that a nucleation of the polymer surface with platinum metals and/or compounds thereof can be ensured without pickling and activation baths in solvents of strong acids and lyes, and without having to accept a reduction of adhesion between the platinum metal nuclei and the polymer surface.

The objective of the invention is achieved in that centers of a Lewis acid or Lewis base are first enriched with a plasma gas adapted to the polymer used in a vacuum treatment, before the polymer surface is nucleated under vacuum, with the platinum metal and/or the platinum metal compound via another plasma gas containing an evaporated platinum metal and/or a platinum metal compound for the nucleophilic and/or electrophilic reaction on the Lewis acids and/or Lewis bases.

By means of the suggested plasma treatment of the polymer surface not only the surface tension of the polymer is reduced in a principally known way, and a good wettability of the subject surface to be coated is achieved, but also a chemical reaction in the surface area is triggered via the formation of centers of Lewis acids or Lewis bases, according to the plasma gas used. The incidental polarisation of the polymer surface is a fundamental prerequisite for a bonding connection between the polymer surface and the metal ions. As Lewis acids and Lewis bases corresponding with each other in strength show a preferential reaction on each other, the polymer surface coated with centers of a Lewis acid or Lewis base is subjected, in another step of conditioning, to a plasma treatment with an evaporated platinum metal and/or a platinum metal compound, with this plasma gas constituting a corresponding Lewis base and/or Lewis acid, so that nucleophilic and/or electrophilic reactions are achieved with the effect that the platinum metal atoms and/or the molecules of the platinum metal compound are durably bound to the polymer surface without losing their catalytic efficiency for the subsequent electroless electrolytic premetallisation.

For the formation of the Lewis acids or Lewis bases on the polymer surface various gases may be used depending on the polymer to be coated in each case. To obtain centers of Lewis bases and/or Lewis acids on the polymer surface in a favorable way, the applied plasma gas may contain oxygen or an oxygenous compound such as carbon oxides (CO, $CO_2$) or water vapor. By means of the oxygen of the plasma gas the polymer molecules at the surface are partly oxygenated in such a way that new hydroxy, carbonyl and carboxy groups are formed, which, due to their polarity, have a strong affinity to the metal ions introduced by the subsequent plasma treatment.

Another favorable way to polarise the polymer surface is the use of a plasma gas with a sulfurous compound for the formation of Lewis acids or Lewis bases. Such sulfurous compounds like sulfur oxides ($SO_2$, $SO_3$), sulfur fluorides ($SF_6$) or hydrosulfide ($H_2S$) lead, in case of a plasma excitation according to the kind of polymer, to a sulfonation of, e.g., aromatic compounds and thus to the desired polarisation of the polymer surface. Other gases reacting on the polymer surface may be used as well, namely nitrogenous compounds such as nitrogen oxides (NO, $NO_2$, $N_2O$) or ammonia ($NH_3$), or halogens or hydrohalogens.

Due to the two-stage plasma treatment, which may be performed consecutively in the same treatment tank, but also in treatment tanks independent from each other, the complex preliminary wet-chemical treatments in pickling and activation baths are avoided, so that the drawbacks related to these preliminary wet-chemical treatments are avoided, too. Nevertheless, a good adhesion is achieved between the platinum metals and the polymer surface, which is indispensable for ensuring a permanent metallisation of the polymer surface. Premetallisation can be done in the conventional way in that the metal provided for precoating is precipitated autocatalytically without any external current supply from the aqueous electrolyte on the polymer surface nucleated with platinum metals. The thickness of this autocatalytic film is chosen such that it is an thin as possible, but sufficiently free from pores, so that the subsequent galvanic precipitation of the metal film proper is not impaired. The thickness of the autocatalytically precipitated metal layer is approx. 0.2–2$\mu$, preferably 1$\mu$. Onto this preliminary coating a thicker metal film of the thickness demanded in each case can be precipitated galvanically under external current supply. However, this preliminary coating may also be coated with layers by way of other coating techniques, for instance if these layers do not permit a galvanic precipitation, or if the latter is not desired.

DESCRIPTION OF THE PREFERRED EMBODIMENTS

In the following examples of embodiment a square flat piece of polymer with a side length of 80 mm and a thickness of 5 mm was put, after usual pre-cleaning, into a treatment tank connected to a vacuum pump, from which the air was evacuated up to a negative pressure of 0.1 mbar, before plasma gas for polarising the polymer surface was passed into the treatment tank, which, at a treatment pressure between 5 and 10 mbar, was excited to ignation of the plasma by means of high frequency. During a preset treatment time the polymer surface was partially chemically changed by the corresponding reaction on the plasma gas, so that centers of Lewis acids and/or Lewis bases were generated. After this treatment of the flat pieces of polymer the plasma gas was evacuated at a negative pressure of 0.1 mbar, before another plasma gas was passed in under evaporation of a platinum metal compound at a pressure of 1 mbar. At a treatment pressure set between 1 and 5 mbar the plasma was ignited again by means of external excitement via radiofrequency, so that, during the subsequent treatment period, the centers of Lewis acids and/or bases on the polymer surface could react on the platinum metal compounds which in fact have some properties of Lewis bases and/or Lewis acids. After ventilation of the treatment tank the flat piece of polymer nucleated with a platinum metal compound on the surface was taken out of the treatment tank and provided with a preliminary metal coat in an autocatalytically active electrolyte without external current supply, with the thickness of the preliminary metal coat being approx. 1 $\mu$m. Onto this preliminary metal coat different layers could be applied in a conventional way, with an altogether excellent adhesion of all layers, achieved due to the good adhesion of the platinum metal compounds on the polymer surface.

EXAMPLE OF EMBODIMENT 1

The flat piece of plastic to be coated consisted of an acrylonitrile-butadiene-styrene-copolymer, whose surface was treated with nitrogen oxide ($N_2O$) as the plasma gas for the formation of strong Lewis bases, for a treatment period of 60 a. Palladium nitrate was used as the platinum metal compound. The carrier gas used was argon. After a treatment period of 30 s for nucleation with the palladium nitrate, a preliminary coat was applied in a nickeliferous, autocatalytic electrolyte, where nickel with 5% in weight phosphorus was precipitated without any external current supply. Onto this preliminary coat a layer of bright copper of a thickness of 50 $\mu$m was galvanically applied under external current supply in the principally known way.

EXAMPLE OF EMBODIMENT 2

Instead of the acrylonitrile-butadiene-styrene-copolymer of the above example of embodiment a flat piece of plastic made of polybutyleneterephthalate was used, which was first subjected to a plasma treatment with a plasma gas composed of half oxygen and half sulfur dioxide for the formation of centers of strong Lewis acids on the piece surface during a treatment period of 480 s. As the platinum metal compound forming a strong Lewis base tetrakis-(-triphenylphosphine)-palladium was chosen, namely in connection with a carrier gas of argon with 5% by volume of hydrogen. The nucleation time was 480 s. Similar to the example of embodiment 1, a layer of nickel with 2% in weight phosphorus was precipitated without current supply from an electrolyte to the polymer surface nucleated with the chosen platinum metal compound. The final galvanic coat, however, was replaced by a coat of lacquer of a two-pot transparent lacquer with a thickness of layer of 5 $\mu$m.

EXAMPLE OF EMBODIMENT 3

Finally, a flat piece of polyethenimide was subjected, under appropriate conditions, to a treatment with a plasma gas of nitrogen with 20% by volume of hydrosulfide, which led to centers of weak Lewis bases on the polymer surface (treatment period 180 s). For the formation of weak Lewis acids allyl palladium chloride was evaporated in a carrier gas of argon, to which ammonia was added, and used for further plasma treatment of the piece of plastic for a treatment period of 120 s. This time, the preliminary coating was applied electrolessly with copper. Metallisation proper was achieved by galvanic precipitation of bright copper under external current supply at a layer of thickness of 50 $\mu$m. Instead of such a galvanically precipitated layer, a layer may also be applied physically in a vacuum, for instance a hard material of titanium nitride (thickness of layer e.g. 1 $\mu$m).

What is claimed is:

1. A process for the application of a metal film on a polymer surface comprising the steps of:
   (a) enrichment of Lewis acids or Lewis bases on said polymer surface by means of a vacuum plasma treatment, said vacuum plasma treatment comprising a plasma gas adapted to said polymer;
   (b) nucleation under vacuum with a catalytically active platinum metal and/or platinum metal compound by means of a second plasma treatment, said second plasma treatment comprising a second plasma gas containing an evaporated form of said platinum metal and/or platinum metal compound for nucleophilic and/or electrophilic reaction on said Lewis acids or said Lewis bases;
   (c) autocatalytic precipitation of a coating of a metal from an aqueous solution without any external current supply; and
   (d) electrolytically applying at least another coating of metal,
   wherein said plasma gas used for the enrichment of said Lewis acids or said Lewis bases on said polymer surface contains a halogen or a hydrohalogen.

2. The process of claim 1, wherein said at least another coating of a metal is applied under external current supply.

3. A process for the application of a metal film on a polymer surface comprising the steps of:

(a) enrichment of Lewis acids or Lewis bases on said polymer surface by means of a vacuum plasma treatment, said vacuum plasma treatment comprising a plasma gas adapted to said polymer;

(b) nucleation under vacuum with a catalytically active platinum metal and/or platinum metal compound by means of a second plasma treatment, said second plasma treatment comprising a second plasma gas containing an evaporated form of said platinum metal and/or a platinum metal compound for nucleophilic and/or electrophilic reaction on said Lewis acids or said Lewis bases;

(c) autocatalytic precipitation of a coating of a metal from an aqueous solution without any external current supply; and (d) electrolytically applying at least another coating of a metal, wherein said plasma gas used for the enrichment of said Lewis acids or said Lewis bases on said polymer surface contains a sulfurous compound.

4. Process according to claim 3, wherein said plasma gas used for the enrichment of said Lewis acids or said Lewis bases on said polymer surface contains ammonia.

5. The process of claim 3, wherein said at least another coating of a metal is applied under external current supply.

6. A process for the application of a metal film on a polymer surface comprising the steps of:

(a) enrichment of Lewis acids or Lewis bases on said polymer surface by means of a vacuum plasma treatment, said vacuum plasma treatment comprising a plasma gas adapted to said polymer;

(b) nucleation under vacuum with a catalytically active platinum metal and/or platinum metal compound by means of a second plasma treatment, said second plasma treatment comprising a second plasma gas containing an evaporated form of said platinum metal and/or a platinum metal compound for nucleophilic and/or electrophilic reaction on said Lewis acids or said Lewis bases;

(c) autocatalytic precipitation of a coating of a metal from an aqueous solution without any external current supply; and (d) electrolytically applying at least another coating of a metal, wherein said plasma gas used for the enrichment of said Lewis acids or said Lewis bases on said polymer surface contains ammonia.

7. The process of claim 6, wherein said at least another coating of a metal is applied under external current supply.

* * * * *

UNITED STATES PATENT AND TRADEMARK OFFICE
CERTIFICATE OF CORRECTION

PATENT NO. : 6,506,293 B1
DATED : January 14, 2003
INVENTOR(S) : Thomas Rumpf

It is certified that error appears in the above-identified patent and that said Letters Patent is hereby corrected as shown below:

Column 3,
Line 8, replace "an" with -- as --;
Line 62, replace "a." with -- s. --;

Column 4,
Line 25, replace "polyethenimide" with -- poletherimide --.

Signed and Sealed this

Thirteenth Day of April, 2004

JON W. DUDAS
*Acting Director of the United States Patent and Trademark Office*